(12) United States Patent
Miyake et al.

(10) Patent No.: US 9,996,296 B2
(45) Date of Patent: Jun. 12, 2018

(54) ELECTRONIC CONTROL UNIT AND METHOD FOR REWRITING DATA

(71) Applicant: Hitachi Automotive Systems, Ltd., Hitachinaka-shi, Ibaraki (JP)

(72) Inventors: Toshifumi Miyake, Isesaki (JP); Yusuke Abe, Isesaki (JP); Koji Yuasa, Isesaki (JP); Toshihisa Arai, Isesaki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 255 days.

(21) Appl. No.: 14/778,896

(22) PCT Filed: Feb. 25, 2014

(86) PCT No.: PCT/JP2014/054484
§ 371 (c)(1),
(2) Date: Sep. 21, 2015

(87) PCT Pub. No.: WO2014/148208
PCT Pub. Date: Sep. 25, 2014

(65) Prior Publication Data
US 2016/0048336 A1      Feb. 18, 2016

(30) Foreign Application Priority Data
Mar. 21, 2013   (JP) .................. 2013-058175

(51) Int. Cl.
*G06F 3/06*    (2006.01)
*G11C 16/16*   (2006.01)
(Continued)

(52) U.S. Cl.
CPC ............. *G06F 3/064* (2013.01); *G05B 15/02* (2013.01); *G06F 3/061* (2013.01); *G06F 3/0679* (2013.01);
(Continued)

(58) Field of Classification Search
CPC ........ G06F 3/061; G06F 3/064; G06F 3/0679; G06F 12/00; G06F 12/0246; G05B 15/02
See application file for complete search history.

(56) References Cited

U.S. PATENT DOCUMENTS

2010/0115188 A1* 5/2010 Lee ..................... G06F 12/0246
                                                                711/103
2013/0275708 A1   10/2013 Doi
2014/0143474 A1*  5/2014 Damle ................ G06F 12/0246
                                                                711/103

FOREIGN PATENT DOCUMENTS

JP    6-162786 A    6/1994
JP    8-202626 A    8/1996
(Continued)

OTHER PUBLICATIONS

International Search Report (PCT/ISA/210) issued in PCT Application No. PCT/JP2014/054484 dated May 27, 2014, with English translation (four (4) pages.
(Continued)

*Primary Examiner* — Reginald Bragdon
*Assistant Examiner* — Mehdi Namazi
(74) *Attorney, Agent, or Firm* — Crowell & Moring LLP

(57) ABSTRACT

An electronic control unit includes: a nonvolatile memory capable of erasing data in units of erasure blocks and also writing data in units of write blocks smaller than the erasure blocks; and a processor. In response to a data rewrite request from outside, the processor of the electronic control unit erases data in a portion of the nonvolatile memory in units of erasure blocks and writes data into the portion of the nonvolatile memory in units of write blocks. The amount of data sent to the electronic control unit from outside is thereby decreased and the time needed to rewrite data in the nonvolatile memory is reduced.

4 Claims, 12 Drawing Sheets

(51) Int. Cl.
  *G06F 12/02*   (2006.01)
  *G06F 12/00*   (2006.01)
  *G05B 15/02*   (2006.01)
(52) U.S. Cl.
  CPC .......... *G06F 12/00* (2013.01); *G06F 12/0246* (2013.01); *G11C 16/16* (2013.01)

(56) References Cited

FOREIGN PATENT DOCUMENTS

| | | |
|---|---|---|
| JP | 8-315596 A | 11/1996 |
| JP | 9-128229 A | 5/1997 |
| JP | 2002-14833 A | 1/2002 |
| JP | 2003-131898 A | 5/2003 |
| JP | 2009-252294 A | 10/2009 |
| JP | 2010-9164 A | 1/2010 |
| WO | WO 2012/081099 A1 | 6/2012 |

OTHER PUBLICATIONS

Kiyohara et al., "Programming Method for Mobile Devices", IPSJ SIG Technical Report, No. 25, Apr. 15, 2010, with partial English translation (nine (9) pages).

Japanese-language International Preliminary Report on Patentability (Chapter II) (PCT/IPEA/409 & PCT/IB/338) issued in PCT Application No. PCT/JP2014/054484 dated Sep. 24, 2015 with English translation (Fifteen (15) pages).

Japanese-language Office Action issued in counterpart Japanese Application No. 2013-058175 dated Jul. 12, 2016 with partial English translation (5 pages).

\* cited by examiner

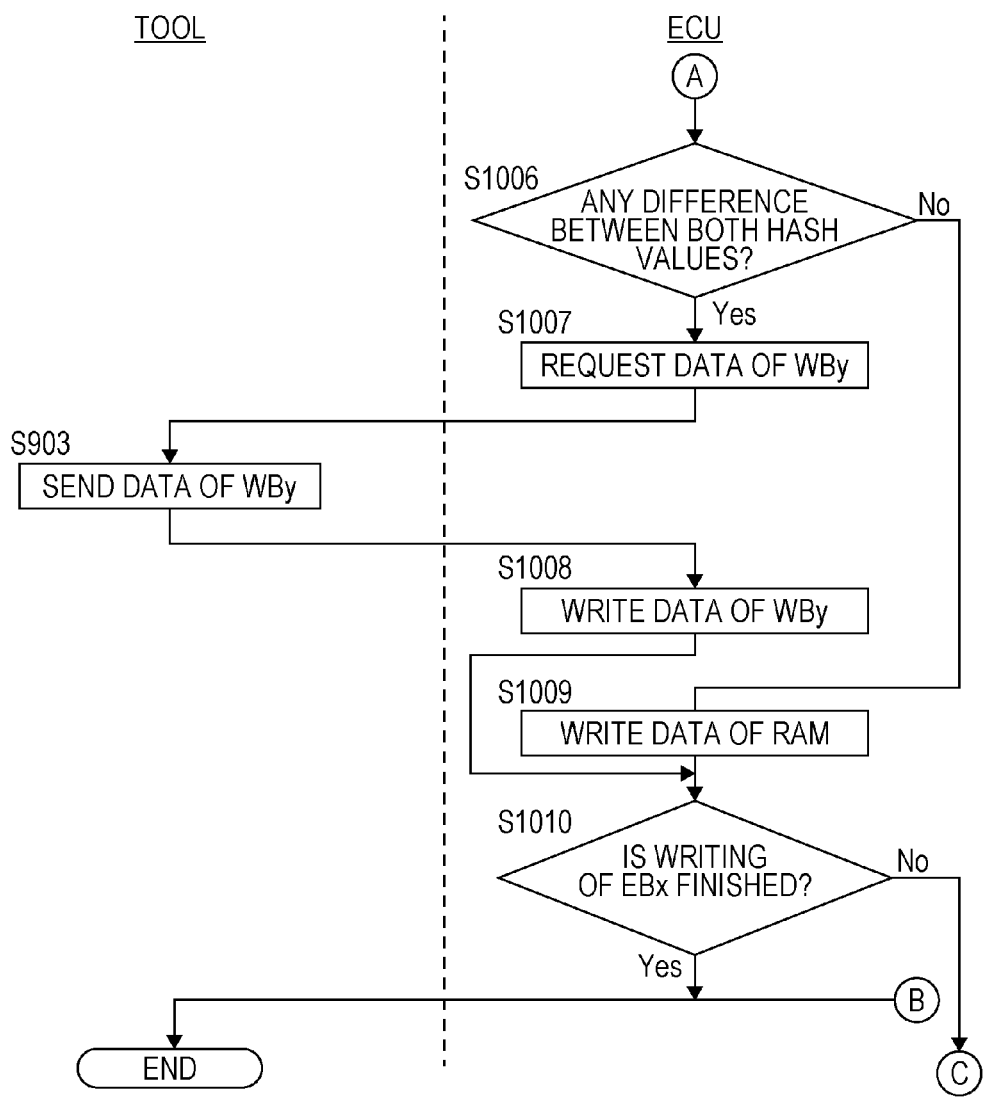

ELECTRONIC CONTROL UNIT AND METHOD FOR REWRITING DATA

CROSS REFERENCE TO RELATED APPLICATIONS

This application is a continuation of PCT International Application No. PCT/JP2014/054484, filed Feb. 25, 2014, which claims priority under 35 U.S.C. § 119 from Japanese Patent Application No. 2013-058175, filed Mar. 21, 2013 the entire disclosures of which are herein expressly incorporated by reference.

The present invention relates to An electronic control unit and technology for rewriting data of an electronic control unit.

BACKGROUND AND SUMMARY OF THE INVENTION

When rewriting data written into a nonvolatile memory such as a flash read only memory (flash ROM) in an electronic control unit, a method such as disclosed in Japanese Patent Application Laid-open Publication No. H9(1997)-128229 (Patent Document 1) has been adopted. That is, after content of a data rewrite area of the nonvolatile memory is erased in response to an instruction from a tool connected to the electronic control unit, data successively sent from the tool is rewritten into the nonvolatile memory.

However, when rewriting data only partially different from data which has been written into the nonvolatile memory, it is necessary to erase all data in the data rewrite area and then to transfer all data from the tool to the electronic control unit. Thus, combined with a slow data transfer speed, a long time is needed to rewrite data in the nonvolatile memory.

Therefore, an object of the present invention is to provide an electronic control unit and a method for rewriting data, capable of reducing the time needed to rewrite data in the nonvolatile memory such as flash ROM.

This and other objects are addressed by an electronic control unit includes: a nonvolatile memory capable of erasing data in units of erasure blocks and also writing data in units of write blocks smaller than the erasure blocks; and a processor, and the electronic control unit is mounted in an automobile. Then, in response to a data rewrite request from outside, the processor of the electronic control unit saves data written into a portion of the nonvolatile memory in a volatile memory and then erases the data, in units of erasure blocks, determines an identity of identification information of data to be written into the nonvolatile memory and identification information of the data saved in the volatile memory, in units of write blocks, and writes the data saved in the volatile memory into the nonvolatile memory when the identity is established, and writes data from outside into the nonvolatile memory when the identity is not established. Thus, the time needed to rewrite data in a non-volatile memory such as flash ROM can be reduced.

BRIEF DESCRIPTION OF THE DRAWINGS

FIG. 13 is a flow chart illustrating the example of the second application embodiment combining the first embodiment and the second embodiment of the data rewrite processing.

DETAILED DESCRIPTION

Hereinafter, embodiments for carrying out the present invention will be described in detail with reference to the accompanying drawings.

Figure 1:
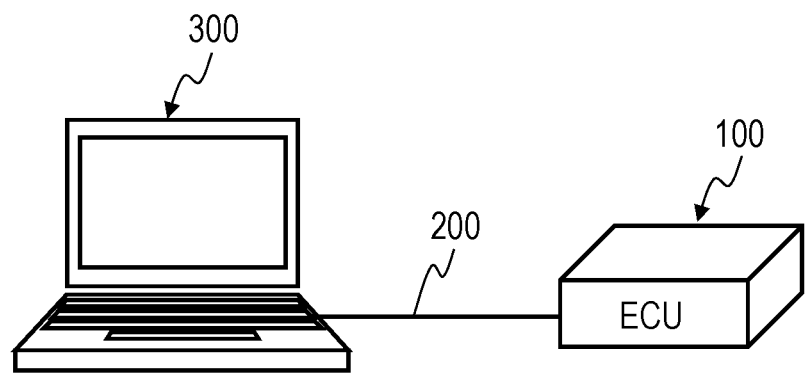
FIG. 1 is a schematic diagram illustrating an example of a data rewrite system in accordance with the present invention.

FIG. 1 illustrates an example of a data rewrite system that rewrites data of an electronic control unit (ECU) mounted in an automobile. An ECU 100 intended for data rewriting is removably connected to a tool 300 through a network cable 200 such as controller area network (CAN), serial communication, or FlexRay (registered trademark). On tool 300, an operator performs data rewrite work of ECU 100. However, ECU 100 and tool 300 are not limited to wire connection using network cable 200 and may be connected to each other wirelessly using a radio transmitter-receiver.

Figure 2:
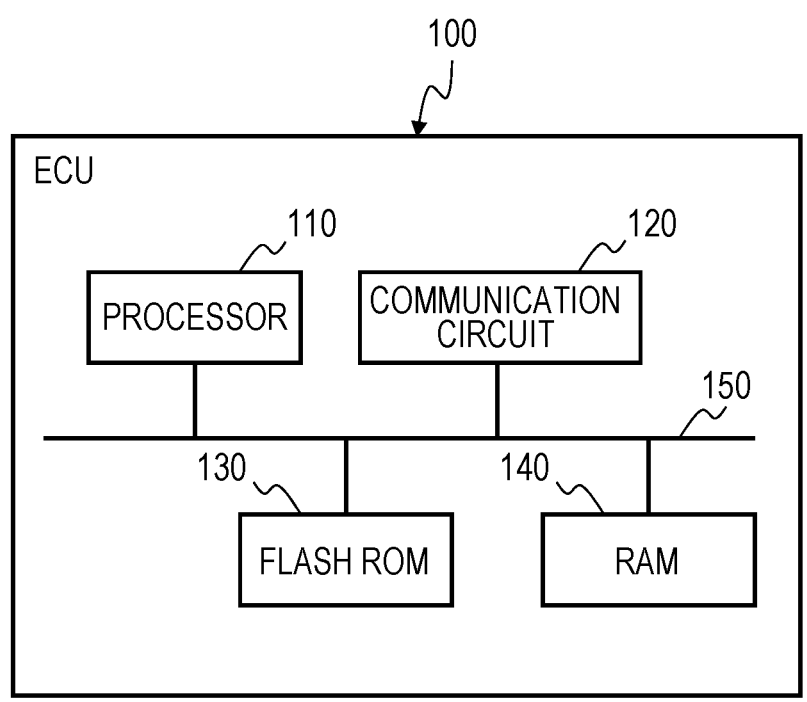
FIG. 2 is an internal structure diagram illustrating an example of an electronic control unit in accordance with the present invention.

ECU 100 is an electronic device that controls various devices mounted in an automobile such as a fuel injector, a transmission, an electric brake system, antilock brake system (ABS), a variable valve timing mechanism, and a brushless motor, and contains a microcomputer. More specifically, ECU 100 includes, as illustrated in FIG. 2, a processor 110 such as a central processing unit (CPU), a communication circuit 120 for connecting to a network, a flash ROM 130 as an example of a nonvolatile memory, a random access memory (RAM) 140 as an example of a volatile memory, and a bus 150 that mutually connects processor 110, communication circuit 120, flash ROM 130, and RAM 140. Communication circuit 120 includes a connector (not illustrated) that removably connects network cable 200.

Figure 3:
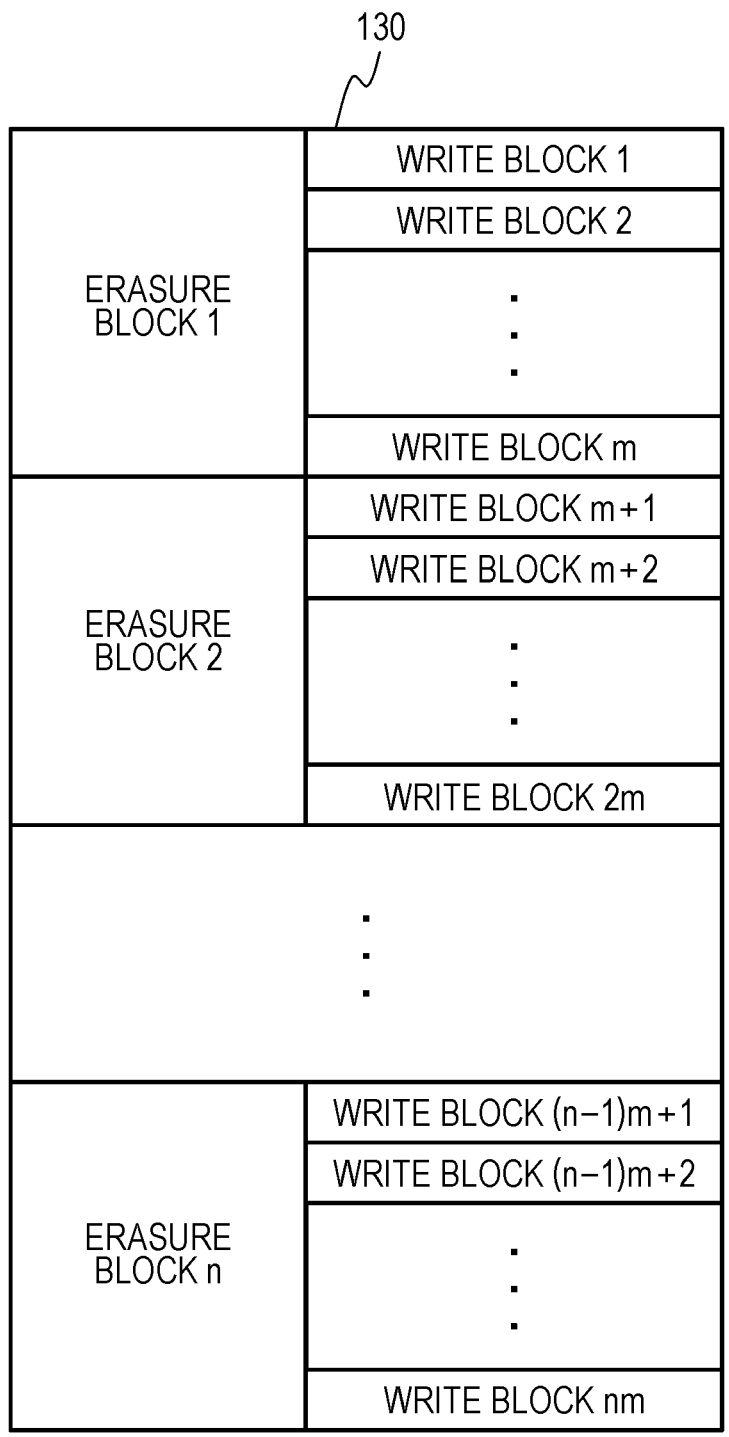
FIG. 3 is an explanatory view illustrating an example of a memory map of flash ROM in accordance with the present invention.

Flash ROM 130 is, as illustrated in FIG. 3, divided into a plurality of erasure blocks from 1 to n of a predetermined size (for example, 32 KB, 64 KB or the like) and each erasure block is divided into a plurality of write blocks from 1 to m of a predetermined size (for example, 256 bytes). The erasure block is a concept to specify the minimum unit to erase data and the write block is a concept to specify the minimum unit to write data, and there is a property that an erasure block is larger than a write block. When data in some write block should be rewritten, a procedure is followed in which all data of the erasure block to which the write block belongs is erased and then data is written into all write blocks belonging to the erasure block, in which data has been erased. This is intended to provide a guarantee when data in flash ROM 130 is rewritten. If the sizes of erasure blocks in flash ROM 130 are not the same, the number of write blocks may be different from erasure block to erasure block.

Figure 4:
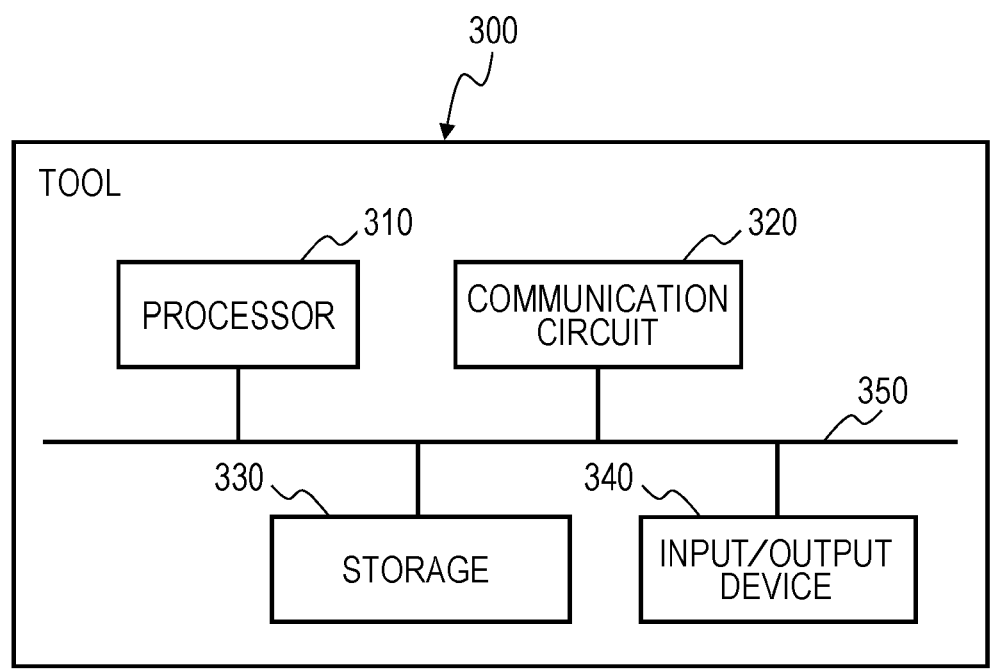
FIG. 4 is an internal structure diagram illustrating an example of a tool in accordance with the present invention.

Tool 300 is an electronic device used by an operator to perform data rewrite work of ECU 100 and is configured by, for example, a computer such as a personal computer. More specifically, tool 300 includes, as illustrated in FIG. 4, a processor 310 such as a CPU, a communication circuit 320 for connecting to a network, a storage 330 such as a hard disk drive or a solid state drive (SSD), and an input/output device 340 serving as an interface for the operator. Communication circuit 320 includes a connector (not illustrated) that removably connects network cable 200. Input/output device 340 includes a display such as an liquid crystal display (LCD), a keyboard, and a pointing device such as a mouse. Storage 330 may be, for example, a network attached storage (NAS) connected to a network (not illustrated) or a server storage.

Storage 330 has rewrite data to rewrite flash ROM 130 of ECU 100 stored therein. The rewrite data includes, for example, a control program for controlling various devices mounted in an automobile and controlling parameters such as constants and maps used by the control program.

Figure 5:
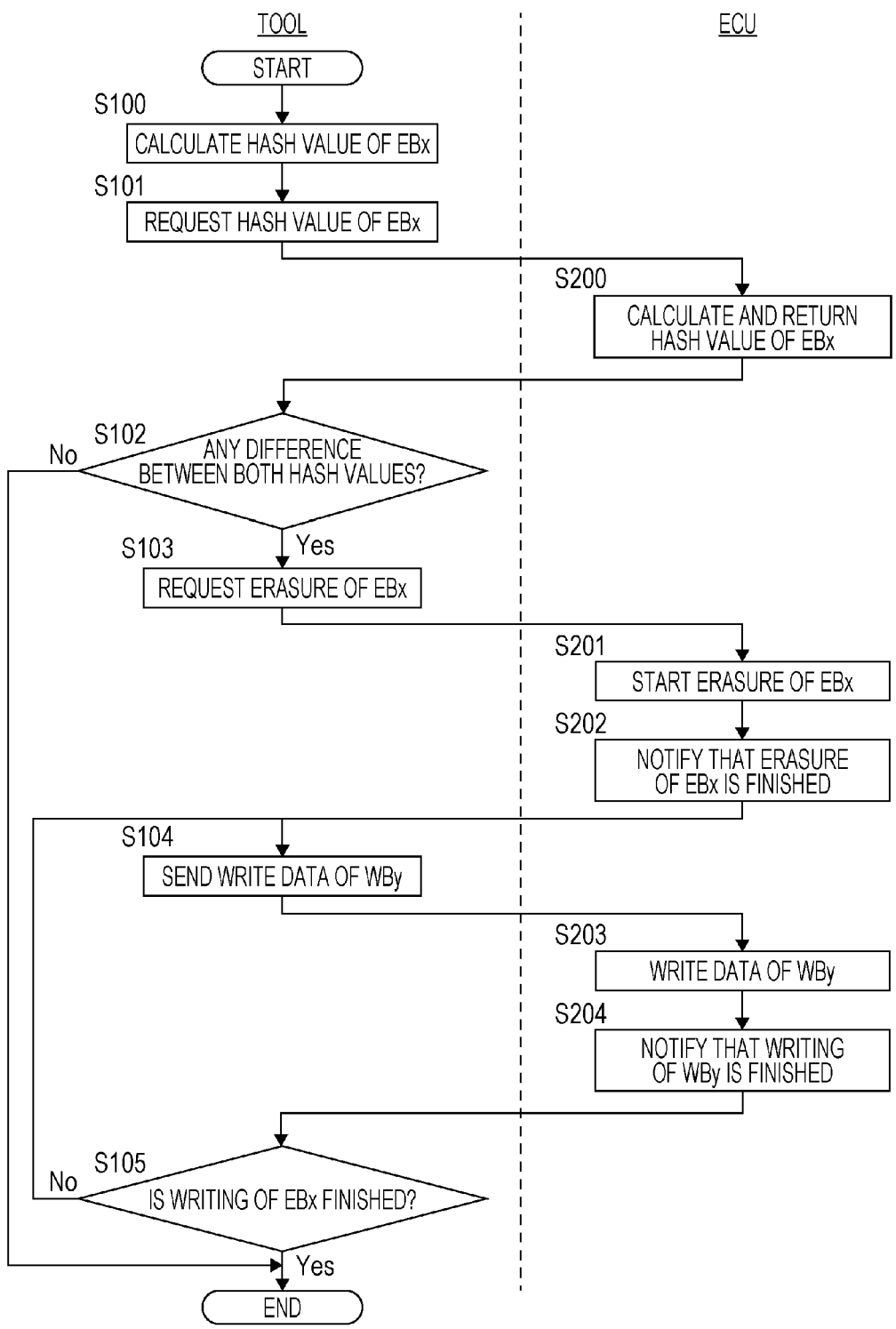
FIG. 5 is a flow chart illustrating an example of a first embodiment of data rewrite processing in accordance with the present invention.

FIG. 5 illustrates an example of the first embodiment of data rewrite processing that rewrites data in flash ROM 130 of ECU 100. The data rewrite processing is performed when the operator specifies rewrite data and data to be rewritten, and performs a predetermined operation on tool 300 after connecting ECU 100 and tool 300 through network cable 200. The data rewrite processing illustrated in FIG. 5 is performed in units of erasure blocks of rewrite data (likewise in a second embodiment).

Figure 6:
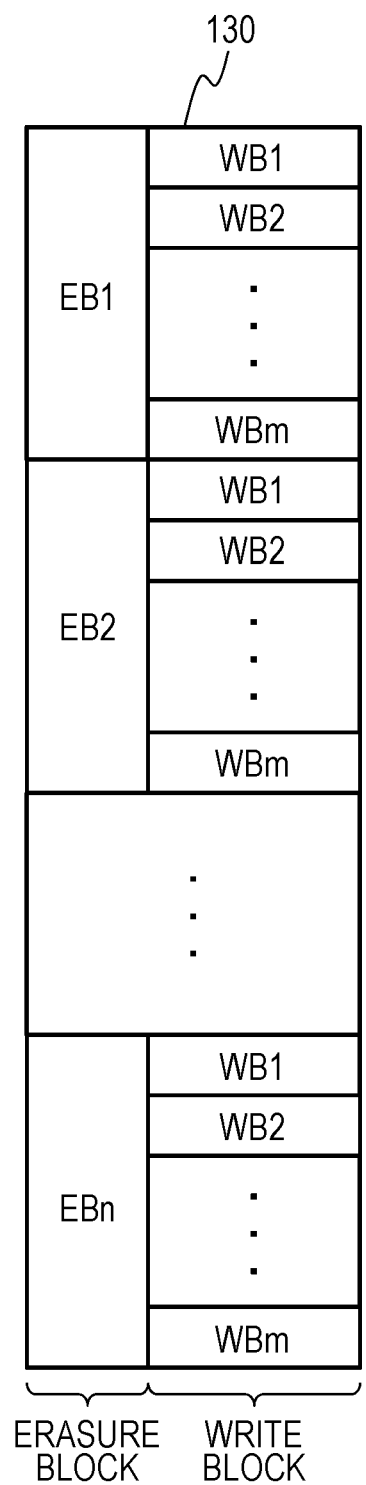
FIG. 6 is an explanatory view of a method of short marking of the memory map of flash ROM in accordance with the present invention.

It is assumed here that ECU 100 is activated by power being supplied thereto when connected to tool 300 through network cable 200, but another form is also possible in which ECU 100 is activated by connection of another power cable. In the following description, for convenience of description, an erasure block of the memory map of flash ROM 130 in ECU 100 is represented by "EBn" and a write block thereof is represented by "WBm" (m and n are natural numbers) as illustrated in FIG. 6.

In step 100 (abbreviated as "S100" in FIG. 5 and this also applies below), processor 310 of tool 300 calculates a hash value of an erasure block EBx (x is a natural number from 1 to n). That is, processor 310 calculates a hash value of data of the erasure block EBx in rewrite data using a publicly known hash function such as secure hash algorithm (SHA), message digest algorithm 5 (MD5) or the like. The hash value is an example of identification information for easily determining the identity of data and a hash value is adopted such that significantly different values are produced for similar data. Then, processor 310 causes a storage medium such as RAM (not illustrated) to temporarily store the hash value calculated from data of the erasure block EBx.

In step 101, processor 310 of tool 300 requests ECU 100 to return the hash value of data of the erasure block EBx of data to be rewritten and written into flash ROM 130 by, for example, specifying the address of the erasure block EBx.

In step 200, in response to the request of the hash value from tool 300, processor 110 of ECU 100 calculates a hash value of data of the erasure block EBx starting with the specified address of the data to be rewritten and written into flash ROM 130. In this case, processor 110 uses the same hash function as that used by tool 300 so that the hash values can be compared by tool 300. Then, processor 110 returns the hash value calculated from the erasure block EBx to tool 300.

In step 102, processor 310 of tool 300 compares the hash value stored in the storage medium with the hash value returned from ECU 100 to determine whether there is any difference between the two hash values. That is, processor 310 determines whether there is any difference of data of the corresponding erasure blocks between rewrite data and data to be rewritten, in short, whether the identity is established therebetween. Then, if determined that there is a difference between the two hash values, processor 310 proceeds to step 103 (Yes) and if determined that there is no difference between the two hash values, processor 310 terminates the processing of the erasure block EBx (No).

In step 103, processor 310 of tool 300 requests ECU 100 to erase data of the erasure block EBx in flash ROM 130. That is, there is a difference of data of the erasure blocks between rewrite data and data to be rewritten, and thus, processor 310 requests ECU 100 to erase data of the erasure block EBx so that the data in the erasure block can be rewritten.

In step 201, in response to the request of erasure from tool 300, processor 110 of ECU 100 erases the data by, for example, writing predetermined data into the erasure block EBx in flash ROM 130.

In step 202, processor 110 of ECU 100 notifies tool 300 that the erasure of data of the erasure block EBx in flash ROM 130 is finished. Such a notification is intended to synchronize ECU 100 and tool 300 (this also applied below).

In step 104, in response to the notification from ECU 100, processor 310 of tool 300 successively extracts data of write blocks WBy (y is a natural number from 1 to m) belonging to the erasure block EBx from rewrite data, and sends the extracted data to ECU 100. That is, processor 310 successively sends data to be written into an area from which data has been erased of a storage area of flash ROM 130 of ECU 100.

In step 203, processor 110 of ECU 100 writes data received from tool 300 into the write block WBy of flash ROM 130.

In step 204, processor 110 of ECU 100 notifies tool 300 that writing of data into the write blocks WBy of flash ROM 130 is finished.

In step 105, in response to the notification from ECU 100, processor 310 of tool 300 determines whether writing of data into the erasure block EBx is finished through, for example, whether processing is finished up to a write block WBm. Then, if determined that data writing is finished, processor 310 terminates the processing of the erasure block EBx (Yes), and if determined that data writing is not finished, processor 310 returns to step 104 (No).

According to the first embodiment of the data rewrite processing, a hash value capable of evaluating the identity of data is used to determine whether there is any difference between rewrite data and data to be rewritten in units of erasure blocks. Then, if there is a difference of data of corresponding erasure blocks between rewrite data and data to be rewritten, a data erasure request of the erasure block for which a difference is found is sent from tool 300 to ECU 100 and also data to be written into write blocks belonging to the erasure block is successively sent. In response to the data erasure request from tool 300, ECU 100 erases data of the erasure block and also writes data successively sent from tool 300 into the write blocks.

On the other hand, if there is no difference of data of corresponding erasure blocks between rewrite data and data to be rewritten, the processing proceeds to the next erasure block without any data erasure request and data communication from tool 300 to ECU 100.

Therefore, when flash ROM 130 of ECU 100 is rewritten using rewrite data in which only a portion of data to be rewritten is changed such as control parameter changes, data erasure and data transfer of flash ROM 130 are performed for the erasure block containing the changed portion. Thus, the total amount of information transferred from tool 300 to ECU 100 is decreased and the time needed to rewrite data of flash ROM 130 can be reduced. The data transfer time from tool 300 to ECU 100 occupies more than half the time needed to rewrite data of flash ROM 130, and therefore, the effect of the reduced transfer amount of data is significant.

In short, by performing data erasure and data transfer only for the erasure block in which there is a difference between rewrite data and data to be rewritten, the time needed to rewrite data of flash ROM 130 can be reduced through the reduction of the communication volume.

Figure 7:
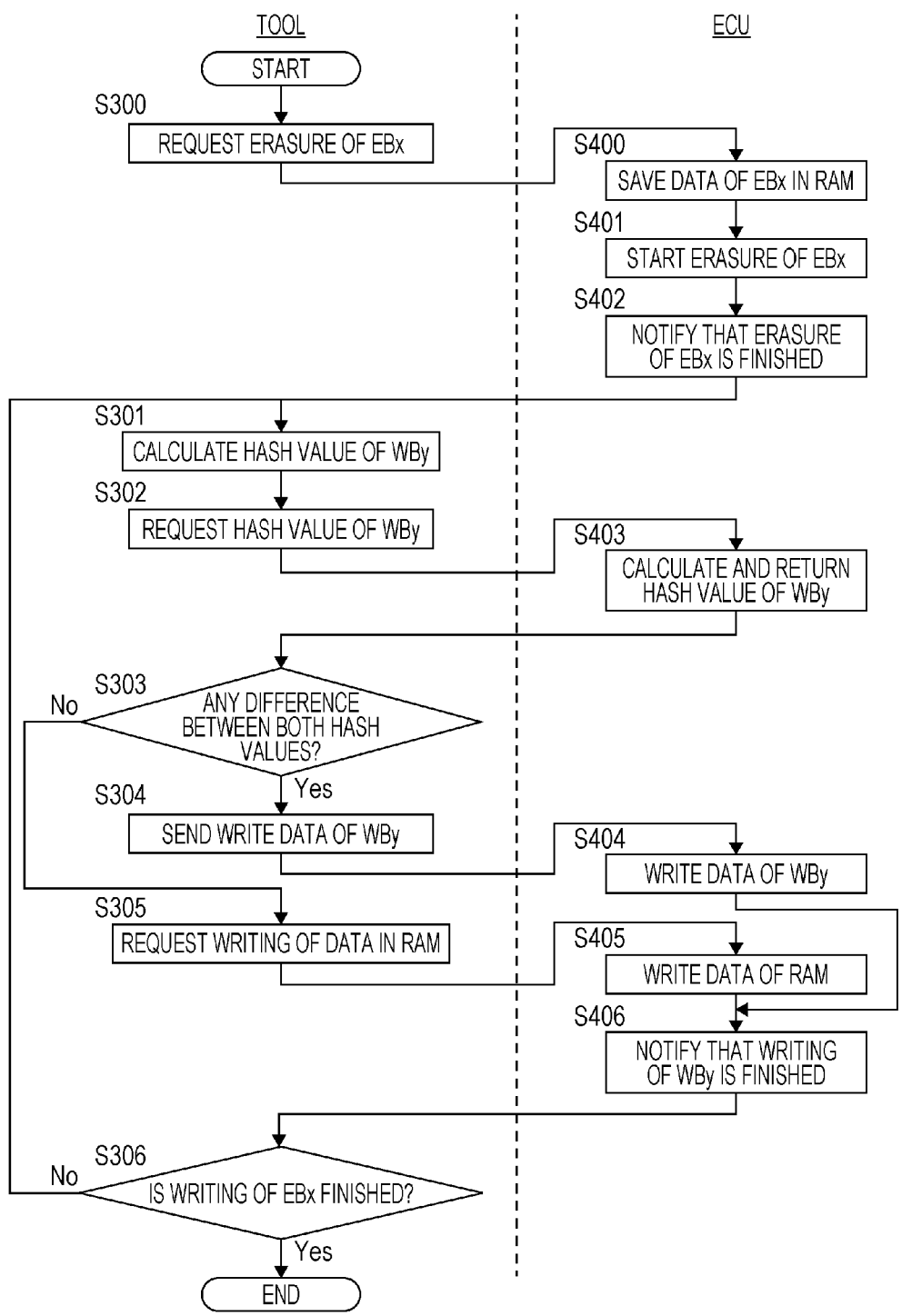
FIG. 7 is a flow chart illustrating an example of a second embodiment of data rewrite processing in accordance with the present invention.

FIG. 7 illustrates an example of the second embodiment of data rewrite processing that rewrites data in flash ROM 130 of ECU 100. The data rewrite processing is performed when the operator specifies rewrite data and data to be rewritten, and performs a predetermined operation on tool 300 after connecting ECU 100 and tool 300 through network cable 200. In the description that follows, processing common to the first embodiment is described briefly from the viewpoint of excluding a duplicate description (this also applies below).

In step 300, processor 310 of tool 300 requests ECU 100 to erase data of the erasure block EBx in flash ROM 130.

Figure 8:
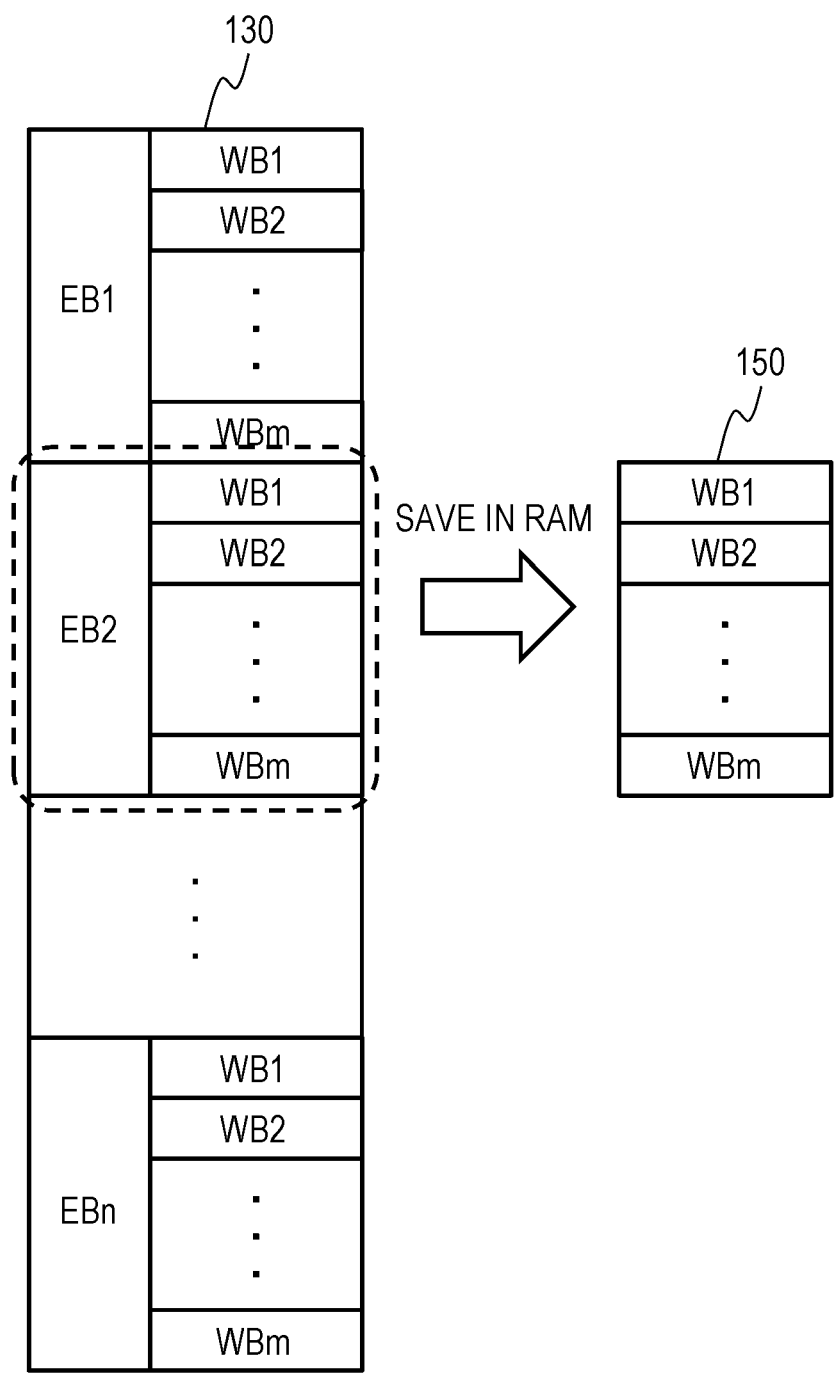
FIG. 8 is an explanatory view illustrating a state in which data of the flash ROM is saved in RAM in accordance with the present invention.

In step 400, in response to the erasure request from tool 300, processor 110 of ECU 100 saves (copies), as illustrated in FIG. 8, data of the write blocks WBy written into the erasure block EBx of flash ROM 130 in RAM 140.

In step 401, processor 110 of ECU 100 erases data of the erasure block EBx in flash ROM 130.

In step 402, processor 110 of ECU 100 notifies tool 300 that data erasure of the erasure block EBx in flash ROM 130 is finished.

In step 301, processor 310 of tool 300 uses a publicly known hash function to successively calculate a hash value of data of each write block WBy belonging to the erasure block EBx of the rewrite data. Then, processor 310 causes a storage medium to temporarily store the hash value calculated from data of the write block WBy.

In step 302, processor 310 of tool 300 requests ECU 100 to return the hash value of data of the write block WBy of data to be rewritten and written into flash ROM 130 by, for example, specifying the address of the write block WBy.

In step 403, in response to the request of the hash value from tool 300, processor 110 of ECU 100 calculates a hash value of data of the write block WBy starting with the specified address of the data to be rewritten and written into flash ROM 130. In this case, processor 110 uses the same hash function as that used by tool 300 so that the hash values can be compared by tool 300. Then, processor 110 returns the hash value calculated from the write block WBy to tool 300.

In step 303, processor 310 of tool 300 compares the hash value stored in the storage medium with the hash value returned from ECU 100 to determine whether there is any difference between the two hash values. That is, processor 310 determines whether there is any difference of data of the corresponding write blocks between rewrite data and data to be rewritten, in short, whether the identity is established therebetween. Then, if determined that there is a difference between the two hash values, processor 310 proceeds to step 304 (Yes), and if determined that there is no difference, processor 310 proceeds to step 305 (No).

In step 304, processor 310 of tool 300 successively extracts data of the write block WBy from the rewrite data and sends the extracted data to ECU 100.

In step 404, processor 110 of ECU 100 writes the data received from tool 300 into the write block WBy of flash ROM 130. Then, processor 110 proceeds to step 406.

In step 305, processor 310 of tool 300 requests ECU 100 to write data of the write block WBy concerning the data of the erasure block EBx saved in RAM 140 into the write block WBy of flash ROM 130.

In step 405, in response to the write request from tool 300, processor 110 of ECU 100 writes data of the write block WBy concerning the data of the erasure block EBx saved in RAM 140 into the write block WBy of flash ROM 130.

In step 406, processor 110 of ECU 100 notifies tool 300 that writing of data of the write blocks WBy is finished.

In step 306, in response to the notification from ECU 100, processor 310 of tool 300 determines whether writing of data into the erasure block EBx is finished through, for example, whether processing is finished up to the write block WBm. Then, if determined that data writing is finished, processor 310 terminates the processing of the erasure block EBx (Yes), and if determined that data writing is not finished, processor 310 returns to step 301 (No).

According to the second embodiment of the data rewrite processing, in response to the erasure request from tool 300, ECU 100 saves data of the erasure block EBx of flash ROM 130 in RAM 140 and then erases the data of the erasure block EBx. Thereafter, whether there is any difference between the write block WBy of the rewrite data and the write block WBy of the data to be rewritten is determined using a hash value capable of evaluating the identity of data. If there is a difference between the rewrite data and the data to be rewritten, data of the rewrite block WBy sent from tool 300 to ECU 100 is written into flash ROM 130. On the other hand, if there is no difference between the rewrite data and the data to be rewritten, data of the write block WBy saved in RAM 140 is written into flash ROM 130.

Thus, excluding various requests and responses, data sent and received between tool 300 and ECU 100 is only write data WBy as a difference between the rewrite data and the data to be rewritten. Therefore, compared with the first embodiment, the total amount of data sent from tool 300 to ECU 100 is further decreased and due to further reduction of the data transfer time, the time needed to rewrite data of flash ROM 130 can further be reduced.

In ECU 100, the sum of the time needed to save data from flash ROM 130 to RAM 140 and the time needed to write data in RAM 140 into flash ROM 130 is shorter than the time needed to send data of the same size from tool 300 to ECU 100. This is because the data transfer speed inside ECU 100 is faster than the data transfer speed from tool 300 to ECU 100. Thus, even if requests and responses sent and received between tool 300 and ECU 100 slightly increase, data sent from tool 300 to ECU 100 decreases, and therefore, compared with the first embodiment, the time needed to rewrite data of flash ROM 130 becomes shorter.

Figure 9:
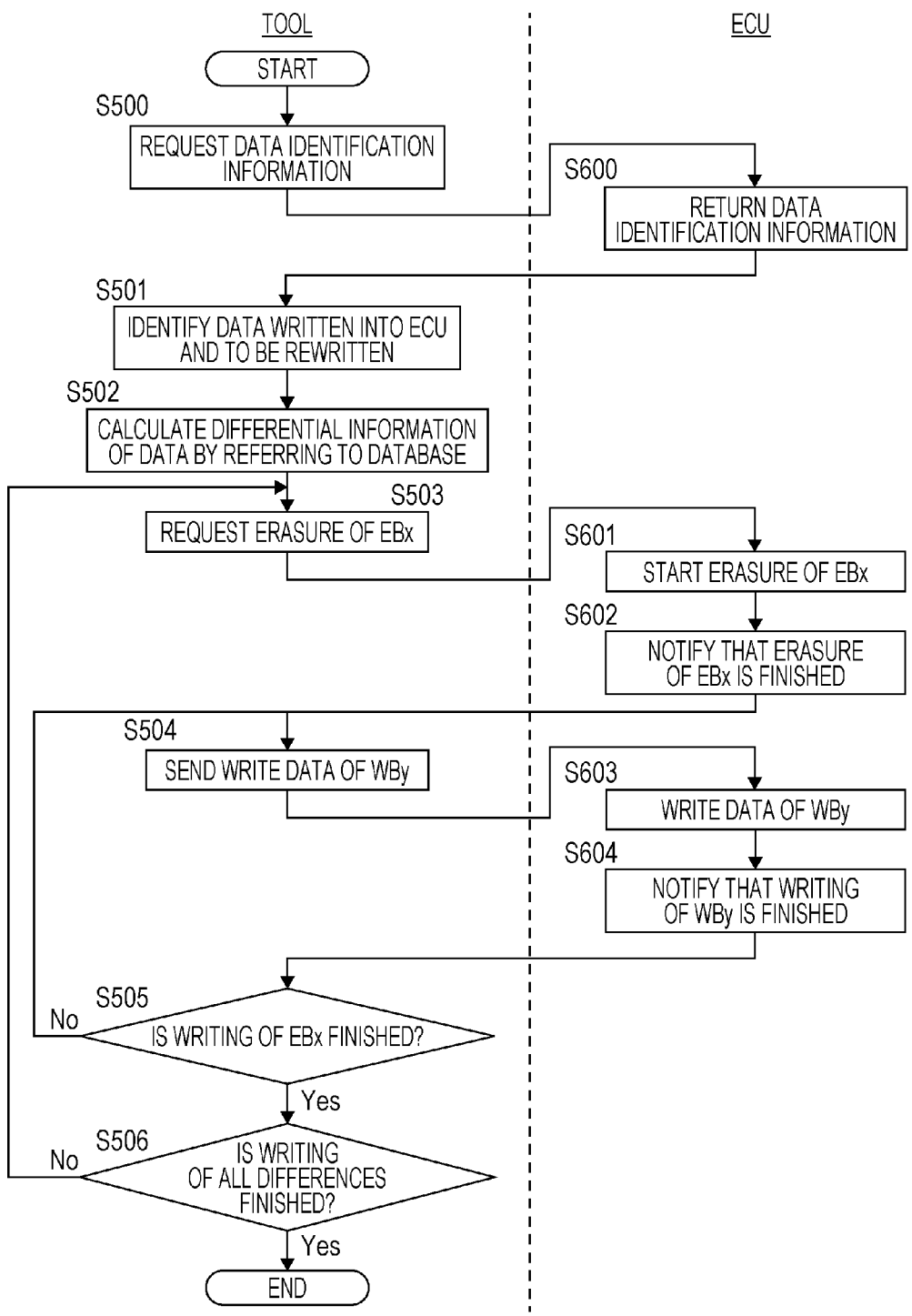
FIG. 9 is a flow chart illustrating an example of a third embodiment of data rewrite processing in accordance with the present invention.

FIG. 9 illustrates an example of a third embodiment of data rewrite processing that rewrites data in flash ROM 130 of ECU 100. The data rewrite processing is performed when the operator specifies rewrite data and data to be rewritten, and performs a predetermined operation on tool 300 after connecting ECU 100 and tool 300 through network cable 200.

As an assumption of the third embodiment of data rewrite processing, a database in which a record to identify whether there is any difference between the rewrite data and the data to be rewritten is stored for each erasure block EBx is constructed in storage 330 of tool 300. In the database, a record to identify whether there is any difference between the rewrite data and the data to be rewritten may be stored for each write block WBy.

In step 500, processor 310 of tool 300 requests ECU 100 to return data identification information for identifying the data to be rewritten.

In step 600, processor 110 of ECU 100 reads data identification information from, for example, the data to be rewritten and written into flash ROM 130, and returns the data identification information to tool 300.

In step 501, based on the data identification information returned from ECU 100, processor 310 of tool 300 identifies the data to be rewritten and written into flash ROM 130 of ECU 100.

In step 502, processor 310 of tool 300 refers to the database of storage 330 to calculate differential information between the rewrite data and the data to be rewritten, that is, information for identifying the erasure block EBx having a difference. More specifically, processor 310 refers to the database to search for records identified by the data identification information of the rewrite data and the data identification information of the data to be rewritten. Then, processor 310 reads the content of the records and compares the corresponding erasure blocks EBx of the rewrite data and the data to be rewritten, to generate differential information.

In step 503, regarding the erasure blocks EBx having a difference between the rewrite data and the data to be rewritten, processor 310 of tool 300 requests ECU 100 to successively erase data of the erasure block EBx of flash ROM 130.

In step 601, in response to the erasure request from tool 300, processor 110 of ECU 100 erases data of the erasure blocks EBx of flash ROM 130.

In step 602, processor 110 of ECU 100 notifies tool 300 that data erasure of the erasure blocks EBx of flash ROM 130 is finished.

In step 504, in response to the notification from ECU 100, processor 310 of tool 300 successively extracts data of the write block WBy belonging to the erasure block EBx from the write data, and sends the extracted data to ECU 100.

In step 603, processor 110 of ECU 100 writes the data received from tool 300 into the write block WBy of flash ROM 130.

In step 604, processor 110 of ECU 100 notifies tool 300 that writing of data into the write block WBy of flash ROM 130 is finished.

In step 505, in response to the notification from ECU 100, processor 310 of tool 300 determines whether writing of data into the erasure block EBx is finished. Then, if determined that writing of data is finished, processor 310 proceeds to step 506 (Yes), and if determined that writing of data is not finished, processor 310 returns to step 504 (No).

In step 506, processor 310 of tool 300 determines whether writing of all differences is finished through whether processing of all erasure blocks EBx having a difference between the rewrite data and the data to be rewritten have been processed. Then, if determined that writing of all differences is finished, processor 310 terminates the data rewrite processing (Yes), and if determined that writing of all differences is not finished, processor 310 returns to step 503 (No).

According to the third embodiment of the data rewrite processing, the database of storage 330 in tool 300 is referred to and differential information between rewrite data and data to be rewritten is calculated. Then, regarding the erasure block EBx having a difference between the rewrite data and the data to be rewritten identified by the differential information, data is erased from the erasure block EBx of flash ROM 130 and data is transferred from tool 300 to ECU 100 into the write blocks WBy. Therefore, in contrast to the first embodiment and the second embodiment described above, there is no need to calculate a hash value to evaluate the identity of rewrite data and data to be rewritten, and when compared with the second embodiment, the time needed to rewrite data in flash ROM 130 can be reduced.

When rewriting the erasure block EBx having a difference between rewrite data and data to be rewritten, like in the second embodiment described above, data of flash ROM 130 may be rewritten by saving data of the erasure block EBx in RAM 140 and sending data of the write block WBy having a difference only from tool 300 to ECU 100. In this case, it is necessary to store a record to identify whether there is any difference between rewrite data and data to be rewritten for each write block WBy in the database of storage 330 of tool 300.

Regarding the first embodiment to the third embodiment of the data rewrite processing, as long as no conflict occurs, technical ideas of each embodiment may appropriately be combined or technical ideas of each embodiment may appropriately be replaced. In the first embodiment to the third embodiment of the data rewrite processing, tool 300 plays a major role of the data rewrite processing, but ECU 100 may play a major role. A concrete example thereof will be described below.

Figure 10:
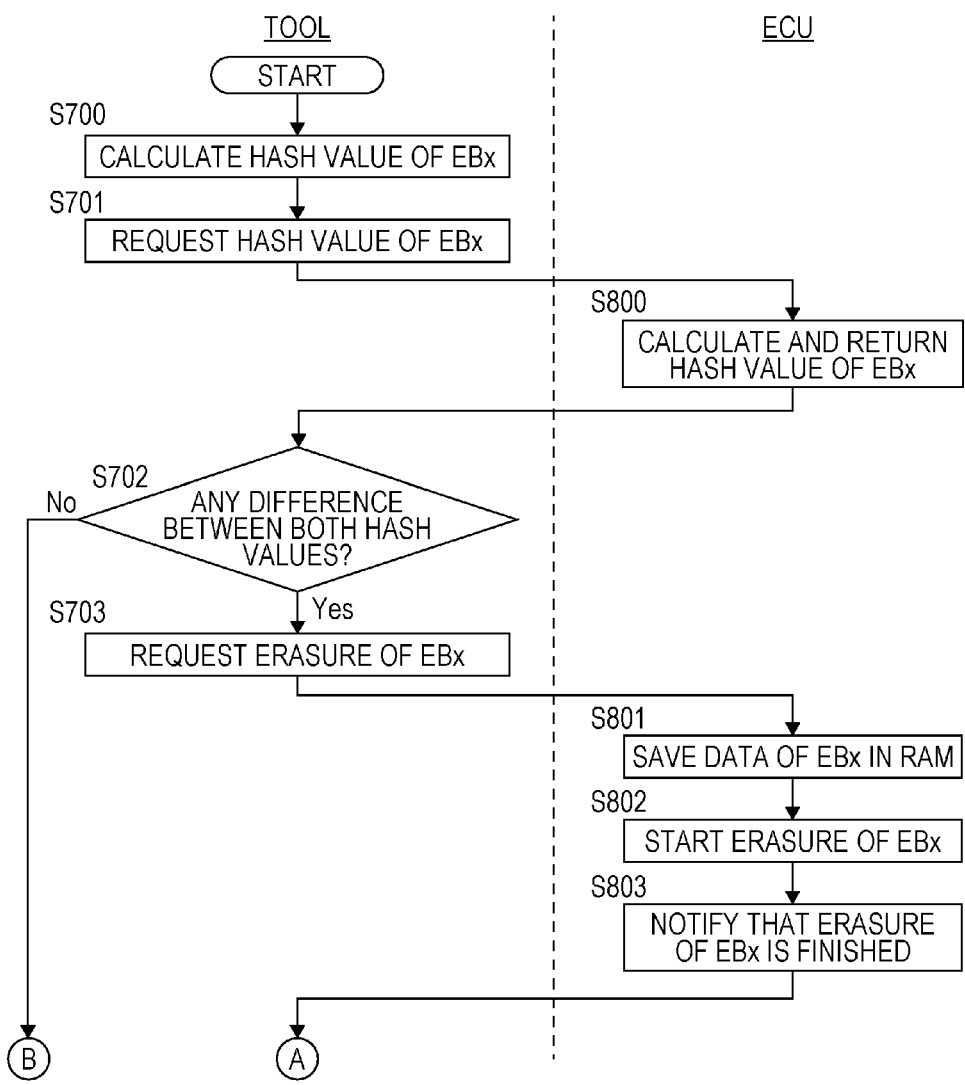
FIG. 10 is a flow chart illustrating an example of a first application embodiment combining the first embodiment and the second embodiment of the data rewrite processing.
Figure 11:
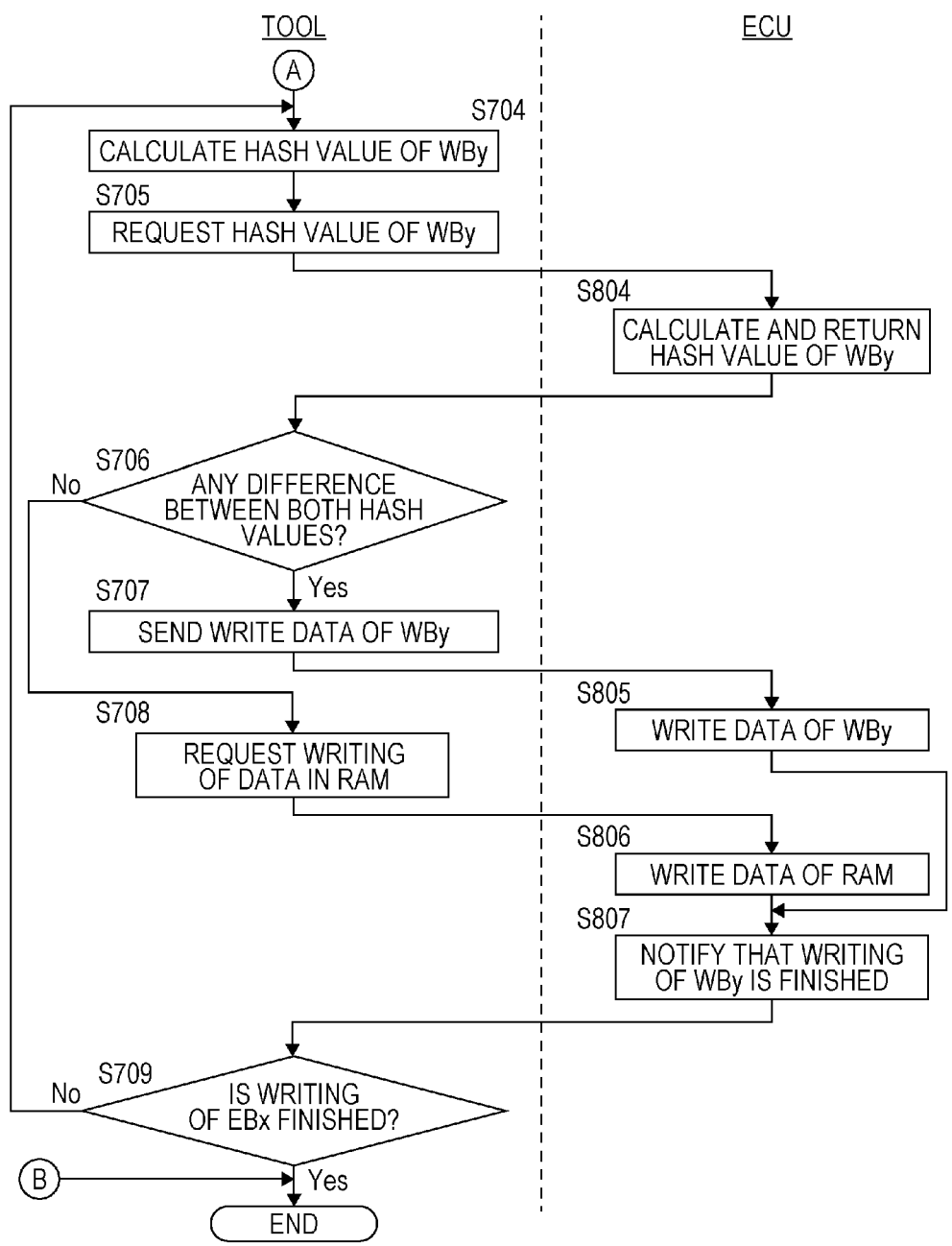
FIG. 11 is a flow chart illustrating the example of the first application embodiment combining the first embodiment and the second embodiment of the data rewrite processing.

FIGS. 10 and 11 illustrate an example of the first application embodiment of the data rewrite processing combining technical ideas of the first embodiment and the second embodiment. The first application embodiment is an embodiment in which tool 300 plays a major role of the data rewrite processing.

In step 700, processor 310 of tool 300 calculates a hash value of data of the erasure block EBx in the rewrite data.

In step 701, processor 310 of tool 300 requests ECU 100 to return the hash value of data of the erasure block EBx in the data to be rewritten.

In step 800, in response to the request of the hash value from tool 300, processor 110 of ECU 100 calculates a hash value of data of the erasure block EBx in the data to be rewritten. Then, processor 110 returns the hash value calculated from the erasure block EBx to tool 300.

In step 702, processor 310 of tool 300 determines whether there is any difference between the hash value of the rewrite data and the hash value of the data to be rewritten regarding the corresponding erasure blocks EBx. Then, if determined that there is a difference between the two hash values, processor 310 proceeds to step 703 (Yes), and if determined that there is no difference between the two hash values, processor 310 terminates the processing of the erasure block EBx (No).

In step 703, processor 310 of tool 300 requests ECU 100 to erase data of the erasure block EBx in flash ROM 130.

In step 801, in response to the erasure request from tool 300, processor 110 of ECU 100 saves data written into the erasure block EBx of flash ROM 130 in RAM 140.

In step 802, processor 110 of ECU 100 erases data of the erasure block EBx in flash ROM 130.

In step 803, processor 110 of ECU 100 notifies tool 300 that the erasure of data of the erasure block EBx in flash ROM 130 is finished.

In step 704, processor 310 of tool 300 uses a publicly known hash function to successively calculate a hash value of data of each write block WBy belonging to the erasure block EBx of the rewrite data.

In step 705, processor 310 of tool 300 requests ECU 100 to return the hash value of data of the write block WBy in the data to be rewritten.

In step 804, in response to the request of the hash value from tool 300, processor 110 of ECU 100 calculates a hash value of data of the write block WBy in the data to be rewritten. Then, processor 110 returns the hash value calculated from the write block WBy to tool 300.

In step 706, processor 310 of tool 300 determines whether there is any difference between the hash value of the rewrite data and the hash value of the data to be rewritten regarding the corresponding write blocks WBy. Then, if determined that there is a difference between the two hash values, processor 310 proceeds to step 707 (Yes), and if determined that there is no difference between the two hash values, processor 310 proceeds to step 708 (No).

In step 707, processor 310 of tool 300 successively extracts data of the write block WBy from the rewrite data and sends the extracted data to ECU 100.

In step 805, processor 110 of ECU 100 writes the data received from tool 300 into the write block WBy of flash ROM 130. Then, processor 110 proceeds to step 807.

In step 708, processor 310 of tool 300 requests ECU 100 to write data of the write block WBy concerning the data of the erasure block EBx saved in RAM 140 into the write block WBy of flash ROM 130.

In step 806, in response to the write request from tool 300, processor 110 of ECU 100 writes data of the write block WBy concerning the data of the erasure block EBx saved in RAM 140 into the write block WBy of flash ROM 130.

In step 807, processor 110 of ECU 100 notifies tool 300 that writing of data of the write blocks WBy is finished.

In step 709, in response to the notification from ECU 100, processor 310 of tool 300 determines whether writing of data into the erasure block EBx is finished. Then, if determined that data writing is finished, processor 310 terminates the processing of the erasure block EBx (Yes), and if determined that data writing is not finished, processor 310 returns to step 704 (No).

According to the first application embodiment of the data rewrite processing, the identity of write blocks of an erasure block having a difference between rewrite data and data to be rewritten is evaluated. Then, if the identity of corresponding write blocks is established, data saved in RAM 140 is written into flash ROM 130, and if the identity of corresponding write blocks is not established, data sent from tool 300 to ECU 100 is written into flash ROM 130.

Therefore, compared with the first embodiment and the second embodiment described above, the total amount of data sent from tool 300 to ECU 100 is further decreased and the time needed to write data into flash ROM 130 can be reduced.

Figure 12:
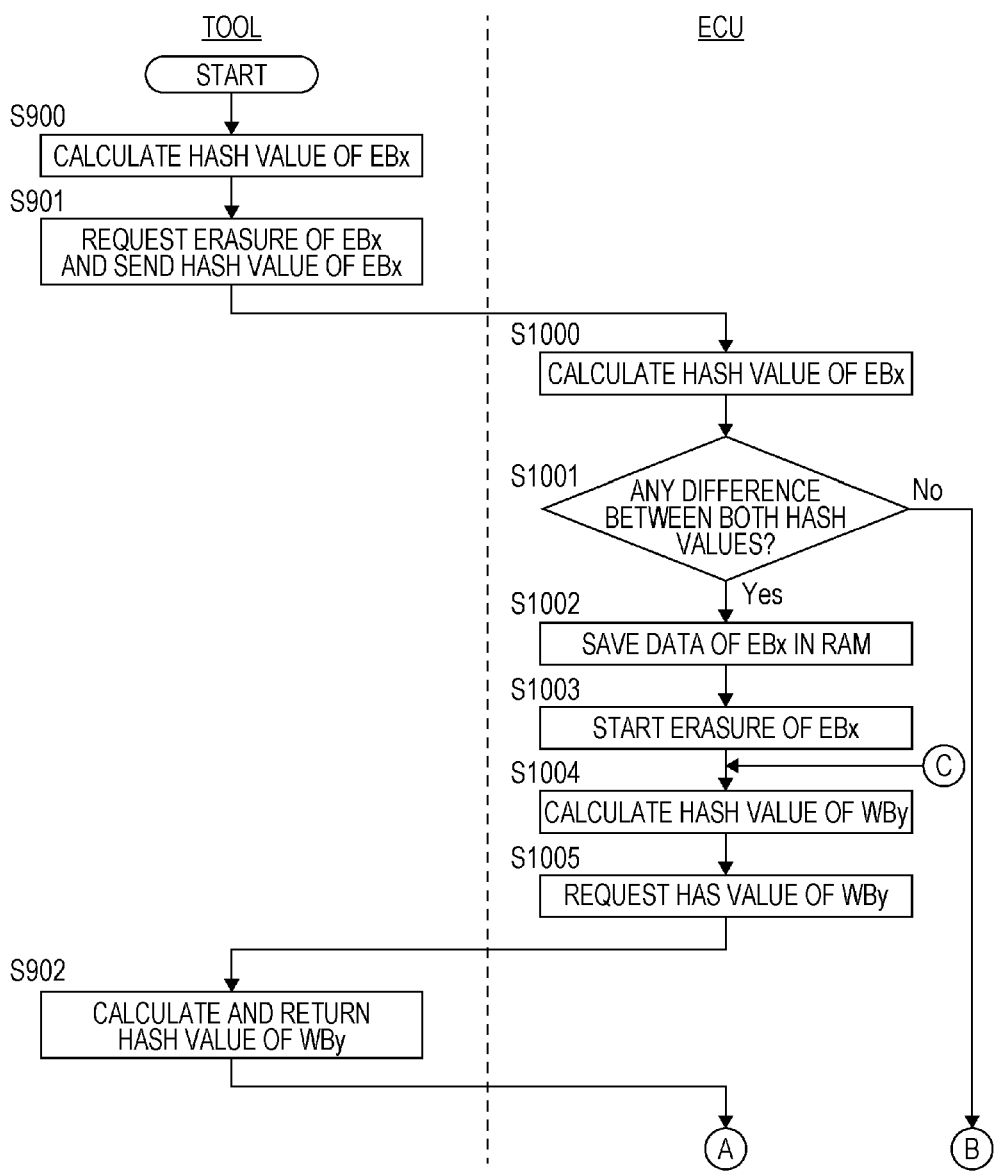
FIG. 12 is a flow chart illustrating an example of a second application embodiment combining the first embodiment and the second embodiment of the data rewrite processing.

FIGS. 12 and 13 illustrate an example of the second application embodiment of the data rewrite processing combining technical ideas of the first embodiment and the second embodiment. The second application embodiment is an embodiment in which ECU 100 plays a major role of the data rewrite processing.

In step 900, processor 310 of tool 300 calculates a hash value of data of the erasure block EBx in the rewrite data.

In step 901, processor 310 of tool 300 requests ECU 100 to erase data of the erasure block EBx in the data to be rewritten and also sends the hash value calculated in step 900.

In step 1000, in response to the erasure request from tool 300, processor 110 of ECU 100 calculates a hash value of data of the erasure block EBx in the data to be rewritten.

In step 1001, processor 110 of ECU 100 compares the hash value received from tool 300 with the hash value calculated in step 1000, to determine whether there is any difference between the two hash values. Then, if determined that there is a difference between the two hash values, processor 110 proceeds to step 1002 (Yes), and if determined that there is no difference between the two hash values, processor 110 terminates the processing of the erasure block EBx (No).

In step 1002, processor 110 of ECU 100 saves data written into the erasure block EBx of flash ROM 130 in RAM 140.

In step 1003, processor 110 of ECU 100 erases data of the erasure block EBx in flash ROM 130.

In step 1004, processor 110 of ECU 100 successively calculates a hash value of data of the write block WBy from the data of the erasure block EBx saved in RAM 140.

In step 1005, processor 110 of ECU 100 requests tool 300 to return the hash value of data of the write block WBy belonging to the erasure block EBx of the rewrite data.

In step 902, in response to the request of the hash value from ECU 100, processor 310 of tool 300 calculates a hash value of data of the write block WBy in the rewrite data. Then, processor 310 returns the hash value calculated from the write block WBy to ECU 100.

In step 1006, processor 110 of ECU 100 determines whether there is any difference between the hash value of the rewrite data and the hash value of the data to be rewritten regarding the corresponding write blocks WBy. Then, if determined that there is a difference between the two hash values, processor 110 proceeds to step 1007 (Yes), and if determined that there is no difference between the two hash values, processor 110 proceeds to step 1009 (No).

In step 1007, processor 110 of ECU 100 requests tool 300 to return data of the write block WBy in the rewrite data.

In step 903, in response to the request from ECU 100, processor 310 of tool 300 successively extracts data of the write block WBy from the rewrite data and sends the extracted data to ECU 100.

In step 1008, processor 110 of ECU 100 writes the data received from tool 300 into the write block WBy of flash ROM 130. Then, processor 110 proceeds to step 1010.

In step 1009, processor 110 of ECU 100 writes data of the write block WBy concerning the data of the erasure block EBx saved in RAM 140 into the write block WBy of flash ROM 130.

In step 1010, processor 110 of ECU 100 determines whether writing of data into the erasure block EBx is finished. Then, if determined that data writing is finished, processor 110 terminates the processing of the erasure block EBx (Yes), and if determined that data writing is not finished, processor 110 returns to step 1004 (No).

According to the second application embodiment of the data rewrite processing, the data rewrite processing is performed by ECU 100 excluding basic erasure requests of the erasure block EBx, returning of hash values of the write blocks WBy, and sending of the write blocks WBy. Thus, even if the data rewrite processing is changed by, for example, an addition of function, there is no need to change processing in tool 300. However, if, for example, the hash function for calculating a hash value of data of the erasure block EBx or write block WBy in rewrite data is changed, processing in tool 300 also needs to be changed, but basic processing is only slightly affected and the amount of change can be reduced. Tool 300 is used in common with various kinds of ECU 100 and thus, such an effect is useful. Other functions and effects are the same as those in the first embodiment and the description thereof may be referred to if necessary.

As described above, by appropriately combining technical ideas of the first embodiment to the third embodiment of the data rewrite processing and appropriately replacing technical ideas of each embodiment, a data rewrite system achieving various functions and effects can be constructed.

In the first embodiment and the second embodiment, hash values of data of the erasure block EBx and write blocks WBy may be calculated in advance and stored by associating with rewrite data and data to be rewritten. In this manner, there is no need to calculate a hash value when data of flash ROM 130 is rewritten, which can reduce the load of tool 300 and ECU 100.

The data rewrite processing into flash ROM 130 of ECU 100 may be performed while ECU 100 is mounted on a vehicle. In this manner, data of ECU 100 mounted on the vehicle can be rewritten even if a control program is changed by, for example, an extension of function.

In the first embodiment and the second embodiment, hash values of data of the erasure block EBx and write blocks WBy may be calculated in advance and stored by associating with rewrite data and data to be rewritten. In this manner, there is no need to calculate a hash value when data of flash ROM 130 is rewritten, which can reduce the load of tool 300 and ECU 100.

The data rewrite processing into flash ROM 130 of ECU 100 may be performed while ECU 100 is mounted on a vehicle. In this manner, data of ECU 100 mounted on the vehicle can be rewritten even if a control program is changed by, for example, an extension of function.

Hereunder, technical concept, which is other than that recited in the claims and is capable of being understood from the above embodiments, will be described.

(A) The electronic control unit according to claim 1, further including a tool connected to the electronic control unit and having a processor, wherein the processor of the tool is configured to send the data rewrite request to the electronic control unit based on differential information between data to be written into the nonvolatile memory and data written into the nonvolatile memory.

(B) The electronic control unit according to (A), wherein the processor of the tool is configured to send the data rewrite request to the electronic control unit for data in units of the erasure blocks having no identity between data to be written into the nonvolatile memory and data written into the nonvolatile memory.

(C) The electronic control unit according to (A), wherein the processor of the tool is configured to refer to a database in which the differential information between data to be written into the nonvolatile memory and data written into the nonvolatile memory is stored, to calculate differential information in accordance with identification information of data sent from the electronic control unit.

(D) The method for rewriting data according to claim 9, wherein a processor of a tool connected to the electronic control unit sends the data rewrite request to the electronic control unit based on differential information between data to be written into the nonvolatile memory and data written into the nonvolatile memory.

(E) The method for rewriting data according to (D), wherein the processor of the tool sends the data rewrite request to the electronic control unit for data in units of the erasure blocks having no identity between data to be written into the nonvolatile memory and data written into the nonvolatile memory.

(F) The method for rewriting data according to (D), wherein the processor of the tool refers to a database in which the differential information between data to be written into the nonvolatile memory and data written into the nonvolatile memory is stored, to calculate differential information in accordance with identification information of data sent from the electronic control unit.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

REFERENCE SYMBOL LIST

100 ECU
110 Processor
120 Communication circuit
130 Flash ROM (nonvolatile memory)
140 RAM (volatile memory)
200 Network cable
300 Tool
310 Processor
320 Communication circuit

The invention claimed is:

1. An electronic control unit mounted in an automobile and comprising: a nonvolatile memory capable of erasing data in units of erasure blocks and also writing data in units of write blocks smaller than the erasure blocks; and a processor configured to
    save data written into a portion of the nonvolatile memory in a volatile memory and then erase the data, in units of the erasure blocks, in response to a data rewrite request from outside,
    determine an identity of identification information of data to be written into the nonvolatile memory and identification information of the data saved in the volatile memory, in units of the write blocks, and
    write the data saved in the volatile memory into the nonvolatile memory when the identity is established, and write data from outside into the nonvolatile memory when the identity is not established.

2. The electronic control unit according to claim 1, wherein
the identification information of the data is a hash value.

3. A method for rewriting data for an electronic control unit mounted in an automobile, and including a nonvolatile memory capable of erasing data in units of erasure blocks and also writing data in units of write blocks smaller than the erasure blocks, and a processor, comprising the steps of:
- saving data written into a portion of the nonvolatile memory in a volatile memory and then erasing the data, in units of the erasure blocks, in response to a data rewrite request from outside, by the processor;
- determining an identity of identification information of data to be written into the nonvolatile memory and identification information of the data saved in the nonvolatile memory, in units of the write blocks, by the processor; and
- writing the data saved in the volatile memory into the nonvolatile memory by the processor when the identity is established, and writing data from outside into the nonvolatile memory by the processor when the identity is not established.

4. The method for rewriting data according to claim 3, wherein
the identification information of the data is a hash value.

* * * * *